(12) United States Patent
Santos Rodriguez et al.

(10) Patent No.: US 11,329,021 B2
(45) Date of Patent: May 10, 2022

(54) METHOD FOR FABRICATING A SEMICONDUCTOR DEVICE COMPRISING A PASTE LAYER AND SEMICONDUCTOR DEVICE

(71) Applicant: Infineon Technologies AG, Neubiberg (DE)

(72) Inventors: Francisco Javier Santos Rodriguez, Villach (AT); Fabian Craes, Soest (DE); Barbara Eichinger, Villach (AT); Martin Mischitz, Wernberg (AT); Frederik Otto, Recklinghausen (DE); Fabien Thion, Villach (AT)

(73) Assignee: Infineon Technologies AG, Neubiberg (DE)

( * ) Notice: Subject to any disclaimer, the term of this patent is extended or adjusted under 35 U.S.C. 154(b) by 25 days.

(21) Appl. No.: 16/685,318

(22) Filed: Nov. 15, 2019

(65) Prior Publication Data

US 2020/0161269 A1    May 21, 2020

(30) Foreign Application Priority Data

Nov. 15, 2018  (DE) ...................... 10 2018 128 748.8

(51) Int. Cl.
*H01L 23/00*  (2006.01)
*H01L 21/48*  (2006.01)
(Continued)

(52) U.S. Cl.
CPC ............ *H01L 24/32* (2013.01); *H01L 21/428* (2013.01); *H01L 21/4867* (2013.01);
(Continued)

(58) Field of Classification Search
CPC ....... H01L 21/78; H01L 21/782; H01L 24/29; H01L 24/32; H01L 24/83; H01L 24/94; H01L 2224/8384; H01L 2221/68318; H01L 2221/68327; H01L 2221/68354; H01L 2221/68381; H01L 2221/6836; H01L 2221/6835
See application file for complete search history.

(56) References Cited

U.S. PATENT DOCUMENTS

| 7,078,265 B2 * | 7/2006 | Terui ................... H01L 23/3114 |
| | | 438/113 |
| 7,405,156 B2 * | 7/2008 | Tanaka .................. H01L 21/288 |
| | | 257/E21.174 |

(Continued)

FOREIGN PATENT DOCUMENTS

| DE | 10 2014 117 245 | 5/2016 |
| DE | 10 2015 119 413 | 5/2016 |

(Continued)

*Primary Examiner* — David A Zarneke
(74) *Attorney, Agent, or Firm* — Dicke, Billig & Czaja, PLLC

(57) ABSTRACT

A semiconductor device and method for fabricating a semiconductor device, comprising a paste layer is disclosed. In one example the method comprises attaching a substrate to a carrier, wherein the substrate comprises a plurality of semiconductor dies. A layer of a paste is applied to the substrate. The layer above cutting regions of the substrate is structured. The substrate is cut along the cutting regions.

16 Claims, 5 Drawing Sheets

(51) Int. Cl.
  *H01L 21/428* (2006.01)
  *H01L 21/782* (2006.01)
(52) U.S. Cl.
  CPC ............ *H01L 21/782* (2013.01); *H01L 24/27* (2013.01); *H01L 2221/6835* (2013.01); *H01L 2221/68318* (2013.01); *H01L 2221/68327* (2013.01); *H01L 2221/68354* (2013.01); *H01L 2221/68381* (2013.01); *H01L 2924/12* (2013.01); *H01L 2924/13055* (2013.01); *H01L 2924/13092* (2013.01)

(56) References Cited

U.S. PATENT DOCUMENTS

| | | | | |
|---|---|---|---|---|
| 7,682,875 | B2* | 3/2010 | Guth | H01L 24/27 |
| | | | | 438/119 |
| 8,257,795 | B2* | 9/2012 | Lu | B22F 1/0059 |
| | | | | 427/383.3 |
| 8,662,377 | B2* | 3/2014 | Palm | H01L 24/83 |
| | | | | 228/253 |
| 8,828,804 | B2* | 9/2014 | Nikitin | H01L 24/32 |
| | | | | 438/119 |
| 9,659,793 | B2* | 5/2017 | Heuck | H01L 21/4842 |
| 9,673,096 | B2* | 6/2017 | Hirschler | H01L 21/288 |
| 9,786,627 | B2* | 10/2017 | Becker | H01L 24/80 |
| 9,997,485 | B2* | 6/2018 | Krishnan | H01L 24/36 |
| 10,032,669 | B2* | 7/2018 | Priewasser | H01L 21/6835 |
| 10,529,574 | B2* | 1/2020 | Yoshida | H01L 29/42316 |
| 10,535,628 | B2* | 1/2020 | Khaselev | H01L 24/27 |
| 2004/0161908 | A1 | 8/2004 | Terui et al. | |
| 2012/0114927 | A1 | 5/2012 | Khaselev et al. | |
| 2015/0069600 | A1 | 3/2015 | Zhang | |
| 2015/0353804 | A1 | 12/2015 | Ghosal et al. | |
| 2017/0113306 | A1 | 4/2017 | Ghoshal et al. | |
| 2020/0258752 | A1* | 8/2020 | Lin | H01L 21/78 |

FOREIGN PATENT DOCUMENTS

| | | | | |
|---|---|---|---|---|
| EP | 1 599 078 | | 11/2005 | |
| EP | 3709347 | A1 * | 9/2020 | ........ H01L 23/488 |
| JP | 2007-73844 | | 3/2007 | |

* cited by examiner

METHOD FOR FABRICATING A SEMICONDUCTOR DEVICE COMPRISING A PASTE LAYER AND SEMICONDUCTOR DEVICE

CROSS-REFERENCE TO RELATED APPLICATION

This Utility Patent Application claims priority to German Patent Application No. 10 2018 128 748.8, filed Nov. 15, 2018, which is incorporated herein by reference.

TECHNICAL FIELD

This disclosure relates in general to a method for fabricating a semiconductor device comprising a paste layer and to a semiconductor device.

BACKGROUND

Electronic devices, for example power electronic devices, may comprise a semiconductor die or semiconductor chip which is attached to a chip pad of a substrate, for example a DCB (direct copper bond) or a leadframe. One example of a joining technique that is used to attach the die to the pad comprises sintering, wherein a paste layer is arranged between the die and the pad and pressure and/or temperature is applied to fabricate a sintered metal layer out of the paste layer. Such joining techniques comprising a sintering process may however be a major contributor to the overall cost of the fabricated electronic device. It is therefore beneficial to provide improved fabrication methods which help to provide reliable sintered joints while reducing fabrication costs. These and other problems are solved by the subject matter of the independent claims.

SUMMARY

Various aspects pertain to a method for fabricating a semiconductor device comprising a paste layer, wherein the method comprises attaching a substrate to a carrier (e.g. an auxiliary carrier), the substrate comprising a plurality of semiconductor dies, applying a layer of a paste to the substrate, structuring the layer above cutting regions of the substrate and cutting the substrate along the cutting regions.

Various aspects pertain to a semiconductor device with a conductive layer, the semiconductor device comprising a semiconductor die comprising a first main side, an opposing second main side and side faces connecting the first main side to the second main side and a layer of an electrically conductive material arranged on the second main side of the semiconductor die, wherein the electrically conductive material covers the second main side of the semiconductor die such that it is recessed from the side faces of the semiconductor die.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Like reference numerals designate corresponding similar parts.

DETAILED DESCRIPTION

Figure 1A:
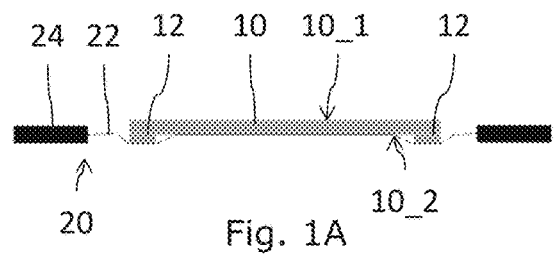
FIGS. 1A-1I illustrate a first example of a method for fabricating a semiconductor device comprising a conductive layer, wherein a paste layer is applied to a substrate and subsequently structured.

In the following examples of a method for fabricating a semiconductor device comprising a conductive layer are shown. These examples have in common that a layer of a paste (e.g. a sintering paste) is applied to a substrate (e.g. a semiconductor wafer) that comprises a plurality of semiconductor chips. Individual semiconductor dies are then separated from the substrate and may each be arranged on a die carrier like a DCB with the layer of the paste or conductive material already arranged on the semiconductor die. The semiconductor die may then be attached to the die carrier by sintering. In other words, the paste may be applied to the plurality of semiconductor dies in a batch process while the semiconductor dies are still part of a single substrate (i.e. the application of the paste may be considered to be part of the "front end" fabrication instead of the "back end" fabrication).

This may yield the following advantages: first, a much larger throughput may be achieved. When applying the paste to the backside of e.g. a wafer instead of the substrates to which the individual dies will later be mounted, it is possible to provide paste depots for hundreds of dies in a single printing step. Second, compared to differences between individual wafers, die pad materials typically have much larger geometric tolerances in thickness (up to 100 μm) and surface roughness (up to tens of micrometers) compared to wafer material, resulting in both significant thickness variations of the printed paste layer (yield loss) and high costs as a result of wear on the printer components (screens/stencils, squeegees). Furthermore, the cycle time is rather low due to the time needed for transport and alignment of the single parts within the printing equipment when handling several substrates instead of one wafer. Third, paste consumption may be reduced. For dealing with material and process tolerances in both the printing and the die placing process, the printed paste pads need to be larger than the die area when printing on substrates like DCBs or leadframes. This results in increased metal paste consumption which may largely be avoided by printing on the wafers themselves. Fourth, usage of the equipment footprint may be improved. The size of the printed paste pads may be significantly smaller than the total size of substrates like DCBs or leadframes (for example 50%). Therefore, when printing on a given number of substrates half the usable machine footprint is not in use. Fifth, a better flexibility and/or reduction of complexity can be achieved. When printing onto substrates like DCBs or leadframes there is the need for customized stencils/screens for each product as dies of different sizes are arranged in different patterns. When printing directly onto the wafer backside die positions and sizes can be easily altered without the need for new stencils/ screens as all wafers of a given geometry can use the same stencils/screens. As a positive side effect, storage and logistics costs of a large amount of different stencils/screens can be reduced. Sixth, a better process stability may be achieved. When purchasing substrates from different manufacturers the wetting properties may vary leading to varying printing results. This can be avoided by printing directly onto the wafer backside whose properties hardly change. More importantly, however, the layout (size & position) of the printed pads on a given substrate is limited by the need for minimum support areas for stencils/screens. The printing of liquid paste close to the insulating structures of a substrate can be critical for quality and may require extensive process development for individual substrate layouts. The latter is avoided by printing directly onto the wafer backside.

FIGS. 1A-1I show a plurality of semiconductor devices in various stages of fabrication according to a first example of a method for fabricating a semiconductor device comprising a paste layer.

FIG. 1A shows a substrate 10 that is attached to a first carrier 20 such that a first main side 10_1 of the substrate 10 faces away from the first carrier 20 and a second main side 10_2 is attached to the first carrier 20.

The substrate 10 comprises a plurality of semiconductor dies (not shown). The semiconductor dies may for example be MOSFETs, IGBTs or diodes. The semiconductor dies may have a (vertical) transistor structure. The substrate 10 may be a semiconductor wafer. The substrate 10 may comprise one or more metallization layers on the first main side 10_1 and/or on the second main side 10_2. The first main side 10_1 may be a front side of the plurality of semiconductor dies and may for example comprise an emitter or source terminal and a gate terminal. The second main side 10_2 may be a backside of the plurality of semiconductor dies and may comprise a backside metallization layer. The second main side 10_2 may comprise a collector or drain terminal. According to another example, the collector or drain terminal and the gate terminal are arranged on one main side of the substrate 10 and the emitter or source terminal is arranged on the opposing main side of the substrate 10.

According to an example, the substrate 10 may comprise a reinforcing structure 12. The reinforcing structure 12 may e.g. be a support ring, wherein the substrate 10 is thicker at the support ring than at the rest of the substrate 10.

The first carrier 20 may be a temporary carrier and may e.g. comprise a foil or tape 22 and a frame 24. The foil may e.g. be a sawing foil, a transfer foil, a thermo-release foil, a UV foil, a grinding tape etc. According to an example, an adhesion material (e.g. glue) is arranged on at least one side of the foil. The first carrier 20 may be configured to mechanically support the substrate 10.

Figure 1B:
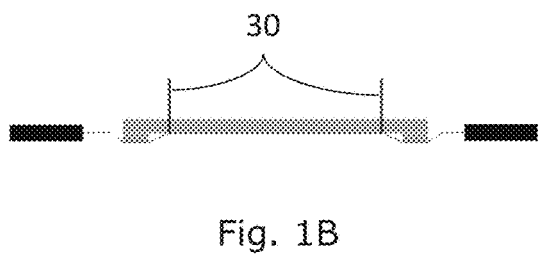

As shown in FIG. 1B, the reinforcing structure 12 may be removed from the substrate 10. Removing the reinforcing structure 12 may for example comprise cutting through the substrate 10 using mechanical, chemical or ablation methods, e.g. a sawing blade or a laser 30 or plasma etching or chemical etching.

Figure 1C:
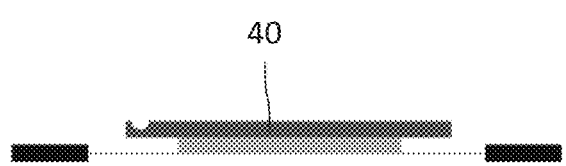

As shown in FIG. 1C, a second carrier 40 may be attached to the substrate 10, e.g. to the first main side 10_1. The second carrier 40 may be a rigid substrate and may e.g. comprise or consist of ceramic, glass, glass-like material or a polymer. The second carrier 40 may be transparent or at least partially transparent. The second carrier 40 may be configured to have a defined alignment relative to the substrate 10 and may comprise a marker that indicates the alignment of the substrate 10 on the second carrier 40. The substrate 10 may be attached to the second carrier 40 in a reversible way, i.e. such that the carrier 40 can be removed again. The second carrier 40 may be configured to mechanically support the substrate 10 even after the reinforcing structure 12 has been removed.

Figure 1D:
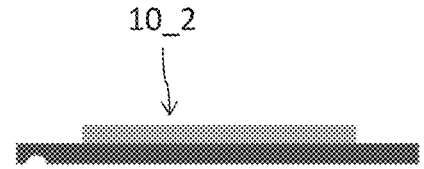

Next, as shown in FIG. 1D, the first carrier 20 may be removed and the second main side 10_2 of the substrate 10 becomes accessible.

Figure 1E:
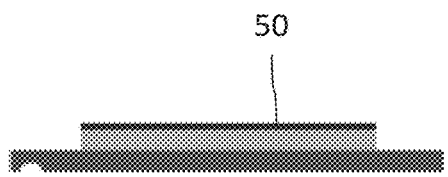

As shown in FIG. 1E, a layer of a paste 50 may be applied to the second main side 10_2. According to an example, applying the paste 50 may comprise a printing process, e.g. stencil printing or screen printing. According to another example, applying the paste may comprise providing a film that comprises a layer of the paste 50 and transferring the paste 50 from the film to the second main side 10_2 of the substrate 10.

The layer of the paste 50 may completely cover the second main side 10_2. The second main side 10_2 may comprise one or more metallization layers, e.g. a backside metallization layer, and the layer of the paste 50 may be arranged on the one or more metallization layers. The paste 50 comprises an electrically conductive material and may further comprise a fluxing agent. The electrically conductive material may comprise individual metal particles having a diameter of 1 µm or more. The paste 50 may comprise one or more of Ag, Au, Cu, Sn, Ni and In. The paste 50 may e.g. be a sinter paste or an electrically conductive glue.

Removing the reinforcing structure 12 before applying the paste 50 may help to obtain a layer with a homogenous thickness. Furthermore, the layer of the paste 50 may be applied to a smaller thickness than it would be possible if the reinforcing structure 12 was still present.

After the layer of the paste 50 has been fabricated, heat or radiation may be applied in order to harden or precure the paste 50. A heating temperature may be in the range of 25° C. to 250° C., in particular 80° C. to 200° C., more in particular about 150° C. Alternatively to or in combination with the heating step, the paste layer can be submitted to any kind of electromagnetic irradiation such as micro waves or photonic curing, such as any form of laser, high energy flash lamps or similar. This may provide the energy required for a transformation of the paste layer to a precured or cured metallic layer.

Figure 1F:
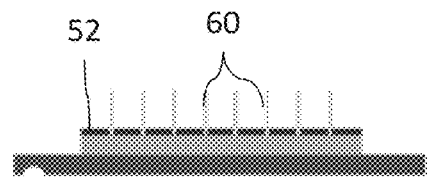

As shown in FIG. 1F, the layer of the paste 50 or the precured layer 52 is structured above cutting regions (kerf regions) of the substrate 10. The structuring of the layer of the paste 50 or the precured layer 52 may comprise (completely) removing the paste 50 or the precured layer 52, e.g. through laser ablation or sawing 60 or plasma etching or chemical etching.

Figure 1G:

After the structuring, as shown in FIG. 1G, the substrate may be placed on a third carrier 70 such that the precured layer 52 is attached to the third carrier 70. The third carrier 70 may be similar or identical to the first carrier 20.

Figure 1H:
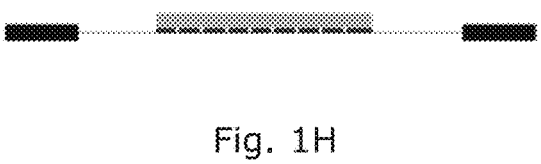

As shown in FIG. 1H, the second carrier 40 may be removed from the first main side 10_1 of the substrate 10.

Figure 1I:
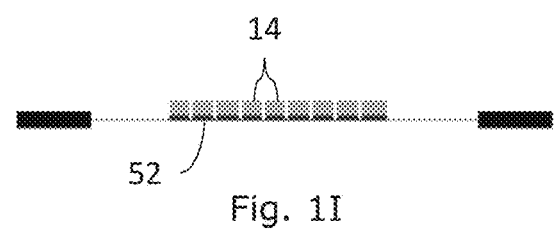

As shown in FIG. 1I, the substrate 10 may be separated into a plurality of semiconductor dies 14 attached to the third carrier 70, wherein each semiconductor die 14 comprises the precured layer 52 on the second main side 10_2.

According to an example, the plurality of semiconductor dies 14 may subsequently be subjected to a backend process which e.g. comprises picking up and attaching a semiconductor die 14 comprising the precured layer 52 to a device carrier (e.g. a DCB) by sintering the precured layer 52 and encapsulating the semiconductor die 14.

FIGS. 2A-2F show a plurality of semiconductor devices in various stages of fabrication according to a second example of a method for fabricating a semiconductor device comprising a conductive layer. Identical reference signs denote similar parts as compared to FIG. 1. Prior to the state shown in FIG. 2A the substrate 10 may be processed as described with respect to FIGS. 1A-1D.

Figure 2A:
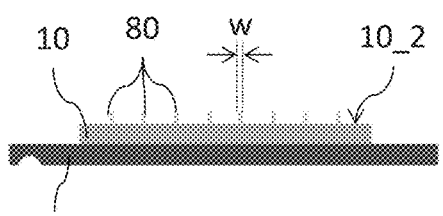
FIGS. 2A-2F illustrate a second example of a method for fabricating a semiconductor device comprising a conductive layer, wherein a mask is applied to a substrate prior to applying a paste layer.

FIG. 2A shows the substrate 10 arranged on the second carrier 40. A mask 80 is arranged over the second main side 10_2 of the substrate 10. For example, the mask 80 may be applied directly to a backside metallization layer on the second main side 10_2. The mask 80 may cover (only) the cutting regions of the substrate 10. A width w of individual lines of the mask 80 may be in the range of 30 μm to 300 μm, in particular about 40 μm or 150 μm.

According to an example, the mask 80 consists of photoresist that is applied to the substrate 10 and structured. According to another example, the mask 80 is a reusable or a peelable mask that is arranged over the substrate 10. The reusable or the peelable mask may e.g. consist of a polymer.

Figure 2B:

As shown in FIG. 2B, the paste 50 is applied to the second main side 10_2 covered by the mask 80. The paste 50 may cover the whole second main side 10_2 except for the parts covered by the mask 80. The mask 80 may stick out of the layer of the past 50.

After the application of the layer of the paste 50, heat or radiation may be used to precure or harden the paste 50 as described above.

Figure 2C:
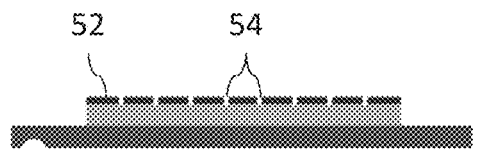
Figure 2D:
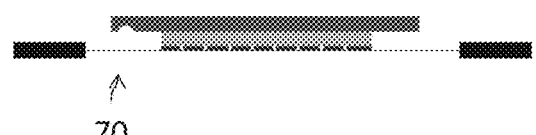
Figure 2E:
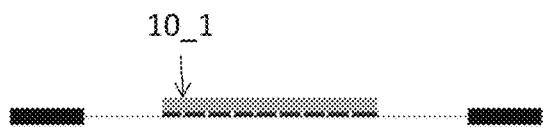

As shown in FIG. 2C, the mask 80 may be removed before or after the paste 50 has been converted into the precured layer 52. Removing the mask 80 may comprise applying a solvent, plasma treatment and/or peeling off the mask 80. In contrast to the fabrication method shown with respect to FIG. 1, no structuring process is necessary at this point because the precured layer 52 already comprises openings 54 above the cutting regions of the substrate 10.

Figure 2F:
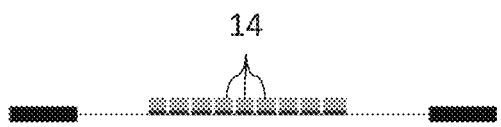

Subsequently, the substrate 10 may be processed as described above with respect to FIGS. 1G to 1I. In particular, the substrate 10 may be transferred to a third carrier 70 (FIG. 2D), the second carrier 40 may be removed from the first main side 10_1 (FIG. 2E) and the substrate 10 may be cut along the cutting regions to separate the semiconductor dies 14 (FIG. 2F).

FIGS. 3A-3H show a plurality of semiconductor devices in various stages of fabrication according to a third example of a method for fabricating a semiconductor device comprising a conductive layer. Identical reference signs denote similar parts as compared to the previous Figures. The third example of the fabrication method essentially differs from the first example shown in FIG. 1 in that the substrate 10 does not have to be transferred to a second carrier 40 but may remain on the first carrier 20 until it is transferred to the third carrier 70.

Figure 3A:
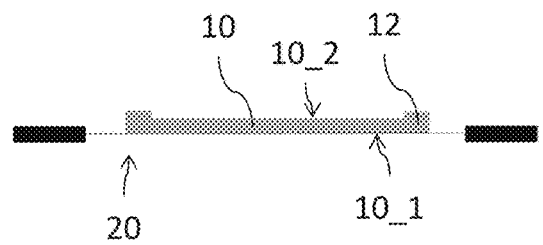
FIGS. 3A-3H illustrate a third example of a method for fabricating a semiconductor device comprising a conductive layer, wherein a paste layer is applied to a substrate and subsequently structured.

As shown in FIG. 3A, the substrate 10 is placed on the first carrier 20 such that the first main side 10_1, which may be the front side of the plurality of semiconductor dies comprised in the substrate 10, faces the first carrier 20. The second main side 10_2, which may be the backside of the plurality of semiconductor dies, and the reinforcing structure 12 face away from the first carrier 20.

Figure 3B:
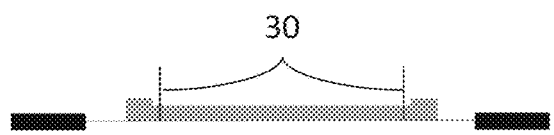
Figure 3C:

As described in more detail with respect to FIG. 1, the reinforcing structure 12 is removed, e.g. using a sawing blade or laser 30 or plasma etching or chemical etching (FIGS. 3B and 3C). Subsequently, the layer of the paste 50 is applied to the second main side 10_2 (FIG. 3D) and precured to fabricate the precured layer 52. The precured layer 52 is structured, e.g. by laser ablation or sawing 60 or plasma etching or chemical etching to expose the cutting regions of the substrate 10 (FIGS. 3E and 3F). Alternatively, the structuring process may be performed prior to the precuring treatment. Alignment means like a marker may be used to ensure that the substrate 10 is properly aligned on the first carrier 20 such that the structures in the paste 50 or precured layer 52, respectively, are indeed aligned with the cutting regions in the substrate 10. The substrate 10 may then be transferred to the third carrier 70 such that the second main side 10_2 comprising the precured layer 52 faces the third carrier 70 (FIG. 3G). The substrate 10 may then be cut along the cutting regions to separate the individual semiconductor dies 14 (FIG. 3H).

Figure 3D:
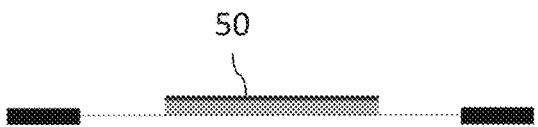
Figure 3E:
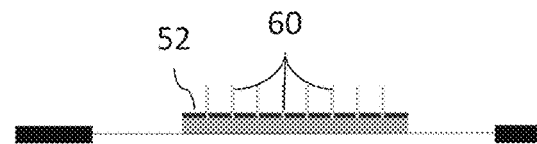
Figure 3F:
Figure 3G:
Figure 3H:
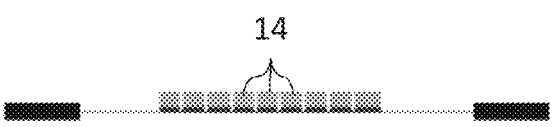
Figure 4A:
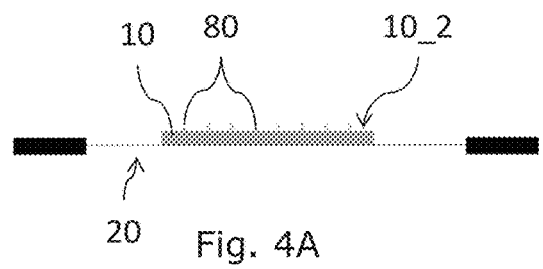
FIGS. 4A-4C illustrate a fourth example of a method for fabricating a semiconductor device comprising a conductive layer, wherein a mask is applied to a substrate prior to applying a paste layer.
Figure 4B:
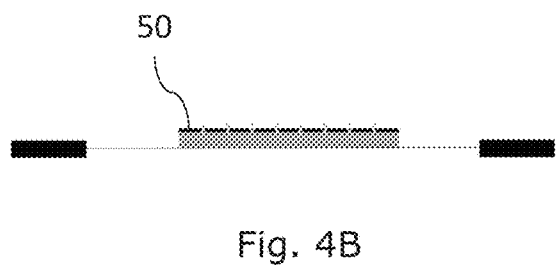
Figure 4C:
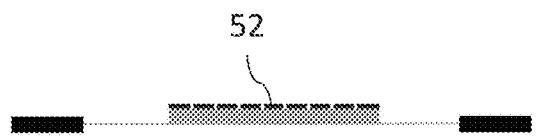

FIGS. 4A to 4C show a plurality of semiconductor devices in various stages of fabrication according to a fourth example of a method for fabricating a semiconductor device comprising a conductive layer. Identical reference signs denote similar parts as compared to the previous Figures. The fourth example of the fabrication method essentially differs from the third example shown in FIG. 3 in that a mask 80 is applied to the substrate 10 prior to applying the paste 50 similar to the second example shown in FIG. 2. Prior to the state shown in FIG. 4A the substrate 10 may be processed as described with respect to FIGS. 3A to 3C.

FIG. 4A shows the substrate 10 arranged on the first carrier 20 such that the second main side 10_2 faces away from the first carrier 20. The mask 80 is arranged on the second main side 10_2 and covers the cutting regions of the substrate 10. FIG. 4B shows the paste 50 applied to the second main side 10_2 masked by the mask 80. After its application, the paste 50 may be precured to produce the precured layer 52 (FIG. 4C). The mask 80 may be removed before or after the precuring treatment. Subsequently, the substrate 10 may be processed as e.g. described with respect to FIGS. 3G and 3H in order to fabricate separated semiconductor dies 14.

Figure 5A:
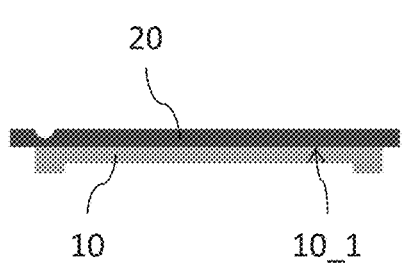
FIGS. 5A-5C illustrate a fifth example of a method for fabricating a semiconductor device comprising a conductive layer, wherein a substrate is arranged on a rigid carrier for processing.
Figure 5B:
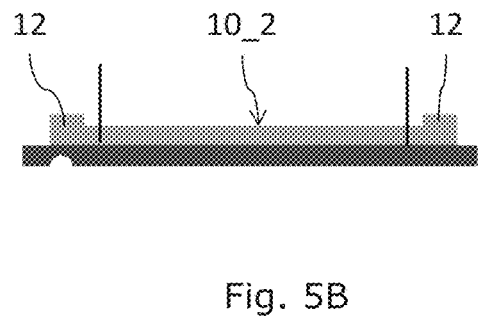
Figure 5C:

FIGS. 5A-5C show a plurality of semiconductor devices in various stages of fabrication according to a fifth example of a method for fabricating a semiconductor device comprising a conductive layer. Identical reference signs denote similar parts as compared to the previous Figures. The fifth example of the fabrication method essentially differs from the first example shown in FIG. 1 in that the substrate 10 is attached to a rigid second carrier 20 at the start of the fabrication method as shown in FIG. 5A.

The substrate 10 may in particular be arranged on the second carrier 20 such that the first main side 10_1 faces the second carrier 20. As shown in FIGS. 5B and 5C, the reinforcing structure 12 may be removed. Subsequently the paste 50 may be applied to the second main side 10_2 and structured above the cutting regions and the plurality of semiconductor dies 14 may be separated as described above.

A sixth example of a method for fabricating a semiconductor device comprising a conductive layer is similar to the first example of FIG. 1. However, instead of using laser ablation or sawing as described with respect to FIG. 1F, an etching mask is applied which covers the whole layer of the paste 50 or the precured layer 52 except over the cutting regions. The layer of the paste 50 or the precured layer 52, respectively, may then be removed over the cutting regions by a suitable etching process. The etching process may be any suitable wet etching process or dry etching process. The etching mask may subsequently be removed.

According to a seventh example of a method for fabricating a semiconductor device, the etching process using the etching mask described in the sixth example may be performed on a substrate 10 that is arranged on a first carrier 20 as e.g. shown in FIG. 3D.

Figure 6:
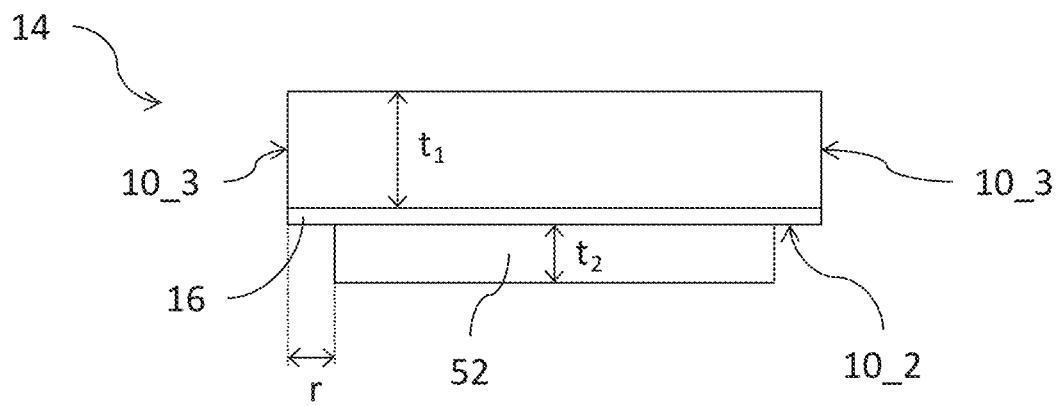
FIG. 6 illustrates a schematic side view of a semiconductor device comprising a conductive layer.

FIG. 6 shows an example of a semiconductor device with a conductive layer, in particular a semiconductor die 14 with an (electrically conductive) precured layer 52 arranged on the second main side 10_2 of the semiconductor die 14. Identical reference signs may denote similar parts as in previous Figures.

According to an example, the semiconductor die 14 comprises a backside metallization layer 16 arranged on the second main side 10_2, wherein the precured layer 52 is arranged on the backside metallization layer 16. The backside metallization layer 16 may comprise a single layer or a layer stack of several (different) metal layers.

The precured layer 52 covers the second main side 10_2 of the semiconductor die 14 such that it is recessed from side faces 10_3 of the semiconductor die 14. In particular, the precured layer 52 may have an offset r as against the side faces 10_3, wherein the offset r is 10 µm or more, 20 µm or more, 30 µm or more or 50 µm or more. According to an example, the offset r may be as small as possible while still allowing to separate semiconductor dies 14 out of a wafer by a mechanical, chemical or ablation method. The precured layer 52 maybe cover about 80% to 100%, in particular 85% to 95% of an active die electrode.

The semiconductor die 14 may have a thickness $t_1$ of about 5 µm or less, 100 µm or less, 700 µm or less, or 2500 µm or less. The semiconductor die 14 may e.g. comprise or consist of silicon or wideband gap materials like GaN, SiC, or $Ga_2O_3$. The precured layer 52 may have a thickness $t_2$ in the range of about 5 µm to 100 µm or even more than 100 µm. The thickness $t_2$ may in particular be about 10 µm or about 15 µm to 40 µm. The precured layer 52 may e.g. comprise or consist of Ag, Au, Cu, In, Ni or Sn. The precured layer 52 may comprise or consist of individual metal particles having a diameter of 20 nm to 100 µm, in particular 50 nm to 20 µm.

Figure 7:
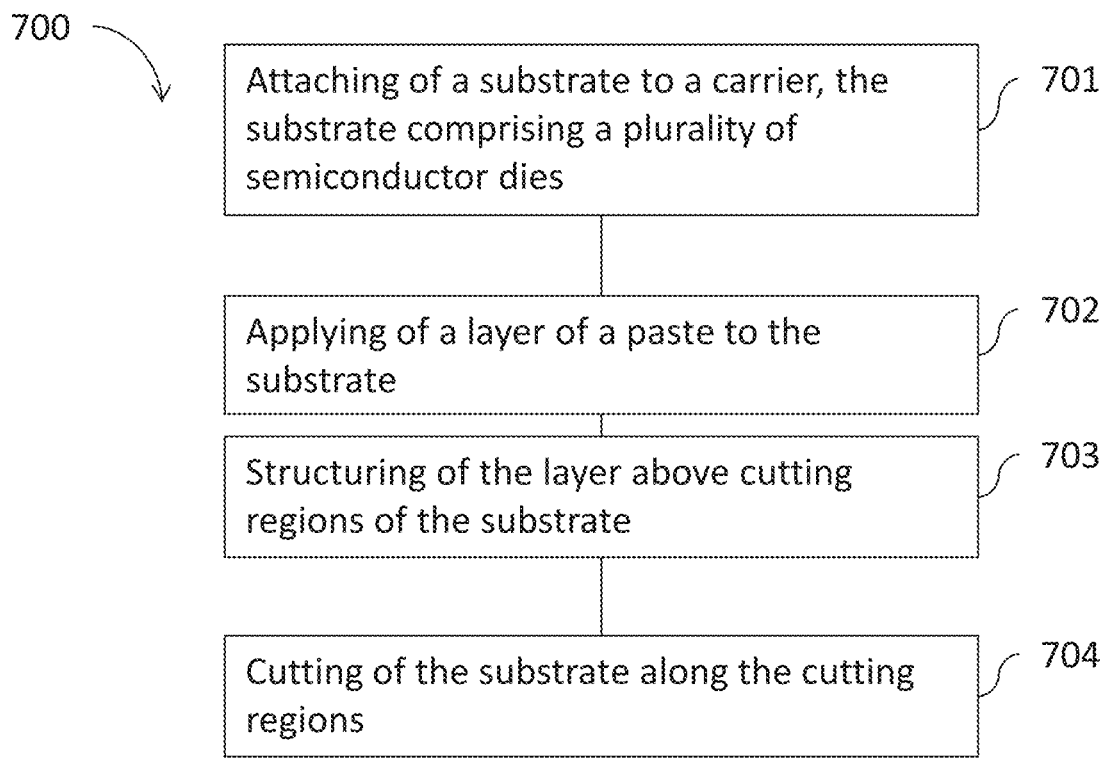
FIG. 7 illustrates a flow chart of a method for fabricating a semiconductor device comprising a conductive layer.

FIG. 7 shows a flow chart of a method 700 for fabricating a semiconductor device comprising a paste layer. The method 700 comprises at 701 an attaching of a substrate to a carrier, the substrate comprising a plurality of semiconductor dies. The method 700 comprises at 702 an applying of a layer of a paste to the substrate, the paste comprising an electrically conductive material. The method 700 comprises at 703 a structuring of the layer above cutting regions of the substrate and the method 700 comprises at 704 a cutting of the substrate along the cutting regions.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A method for fabricating a semiconductor device comprising a paste layer, the method comprising:
   attaching a substrate to a first carrier, the substrate comprising a plurality of semiconductor dies;
   applying a layer of a paste to the substrate;
   precuring the paste, wherein precuring the paste comprises applying electromagnetic irradiation;
   structuring the layer above cutting regions of the substrate;
   attaching the layer to a second carrier;
   removing the first carrier from the substrate; and
   cutting the substrate along the cutting regions.

2. The method of claim 1, wherein the paste comprises an electrically conductive material.

3. The method of claim 2, wherein the paste is a sinter paste.

4. The method of claim 1, where the electromagnetic radiation comprises microwaves or photonic curing.

5. The method of claim 1, where applying electromagnetic radiation includes using a laser or high energy flash lamp.

6. The method of claim 1, wherein precuring the paste comprises in addition applying heat in a range of 25° C. to 250° C.

7. The method of claim 1, wherein the semiconductor dies comprise a backside metallization layer and wherein the paste is applied to the backside metallization layer.

8. The method of claim 1, wherein the substrate comprises a reinforcing structure and wherein the method further comprises:
   removing the reinforcing structure prior to applying the paste.

9. The method of claim 4, wherein the structuring comprises removing the paste above the cutting regions after the precuring.

10. The method of claim 9, wherein the paste is removed by physical or chemical methods.

11. The method of claim 1, further comprising:
    masking the substrate above the cutting regions prior to applying the paste.

12. The method of claim 11, wherein the substrate is masked using photoresist.

13. The method of claim 1, wherein the structuring comprises arranging a photomask on the layer of the paste and removing the paste above the cutting regions.

14. The method of claim 1, wherein the second carrier is a temporary carrier and wherein the method further comprises:
    removing the plurality of semiconductor dies from the temporary carrier.

15. The method of claim 1, wherein the applying the layer of the paste comprises a printing process.

16. The method of claim 1, wherein the applying the layer of the paste comprises transferring the paste from a film onto the substrate.

* * * * *